United States Patent [19]

McCullough et al.

[11] Patent Number: 4,531,059
[45] Date of Patent: Jul. 23, 1985

[54] NON-DELINEATED SEMICONDUCTOR DETECTOR ARRAY FOR INFRA-RED

[75] Inventors: John B. McCullough, Marlboro; Craig A. Mortensen, Chelmsford, both of Mass.

[73] Assignee: Honeywell Inc., Minneapolis, Minn.

[21] Appl. No.: 569,012

[22] Filed: Jan. 9, 1984

[51] Int. Cl.$^3$ .............................................. G01T 1/22
[52] U.S. Cl. ................................ 250/370; 250/211 R; 250/332
[58] Field of Search ................ 250/211 R, 370 G, 332

[56] References Cited

U.S. PATENT DOCUMENTS 3,995,159 11/1976 Elliott et al. ................... 250/370 G Primary Examiner—John D. Welsh
Attorney, Agent, or Firm—John S. Solakian; Laurence J. Marhoefer

[57] ABSTRACT

A detector comprising an elongated strip of semiconductor material which is photoconductive by the generation of electron and hole photocarriers when an image is moved along the strip. The strip includes an active region and a readout region. A first bias current is applied through the active region of the strip thereby producing an ambipolar drift of photocarriers in the strip whose velocity substantially matches the velocity of the movement of the image along said strip. A second bias current is applied to the readout region of the strip so that the drift of the photocarriers in the readout region has a velocity which is greater than the velocity of the drift of the photocarriers in the active region of the strip, thereby decreasing the time for readout.

11 Claims, 3 Drawing Figures

NON-DELINEATED SEMICONDUCTOR DETECTOR ARRAY FOR INFRA-RED

BACKGROUND OF THE INVENTION

The present invention generally relates to thermal imaging devices and systems, and, more specifically, relates to infrared detector arrays used in such thermal imaging systems.

Thermal imaging systems are used to convert a focused radiation image, principally in the infrared spectral region, of the temperature and thermal emissivity differences within a given scene into a visible picture. In such systems, the image may be scanned region-by-region over one or more detector devices or elements which transform the infrared radiation into an electrical signal. After suitable amplification and electronic processing, this signal can be used to energize an electrooptic transducer or display, such as a cathode ray tube, to provide a visual picture. The detector elements can be made from a semiconductor material, such as mercury cadmium telluride, so that the electrical signal is obtained from a photo-current consisting of free electrons and holes liberated from the bound molecular structure of the material by the infrared photons.

One such system employs a single detector element over which the whole image is scanned; but improved performance is obtained by using a plurality of detector elements, usually in a line (linear array). The image may be scanned and the elements arranged in such a way that each element samples a separate part of the same image, and, therefore, operates on a reduced frequency bandwidth, providing an overall improvement in signal-to-noise ratio as compared with a single element detector. This mode of operation is known as the "parallel scan" mode. Alternatively, the image may be scanned and the elements arranged in such a way that each region or spot of the image is focused onto each element in turn. The signals detected by the individual elements are added together so as to correlate with one another, but the noise associated with each is uncorrelated. Thus, this mode of operation, which is known as the "serial scan" mode, also provides an overall improvement in signal-to-noise ratio.

For both the parallel and serial scan mode type of systems, it is necessary to provide at least one electrical lead for each detector element, plus one common lead from the cooling vessel. The number of electrical leads involved consequently makes encapsulation of the detector elements difficult and expensive to provide. A detector device which minimizes the number of electrical leads required to be brought out therefrom is shown in U.S. Pat. No. 3,995,159, issued Nov. 30, 1976, entitled "Thermal Imaging Systems," the inventor of which is Charles Thomas Elliot. Such patent describes a single three-electrode linear detector which replaces the conventional series or parallel linear detector array in a scanned image thermal detection system. Such detector described in such patent comprises an elongated semiconductor/photoconductor strip of mercury cadmium telluride. A bias current in the strip is arranged to give a photocarrier drift velocity in the strip which matches the image scanning velocity, thereby giving enhanced image resolution. Modulation and photocarrier current which constitutes the detected image is measured as a resistivity change between two readout electrodes positioned at one end of the elongated semiconductor/photoconductor strip. One problem associated with such elongated semiconductor/photoconductor strip is the time required for signal readout at the two readout electrodes positioned near one end of the strip.

It is, accordingly, a primary object of the present invention to provide a single detector in the form of an elongated semiconductor/photoconductor strip which includes a mechanism for decreasing the time for signal readout of such strip.

SUMMARY OF THE INVENTION

These and other objects of the present invention are achieved by providing detector apparatus which includes an elongated strip of semiconductor material which is photoconductive by the generation of electron and hole photocarriers when a radiation image is scanned along the strip. Such detector apparatus also includes a mechanism for applying lengthwise through the strip a bias electric current producing an ambipolar drift of photocarriers in the strip. The velocity and direction of drift match respectively the velocity and direction of the scanning of the radiation image along the strip. Also included in such detector apparatus are first and second readout electrodes connected to the strip near one end of the strip, wherein the strip has an active length and wherein the readout electrodes have a separation such that minority photocarriers in the drift reach the separation between the readout electrodes in a time less than the average electron-hole recombination time of the semiconductor material. Such detector apparatus also includes a second bias electric current coupled such that the ambipolar drift of photocarriers is swept through the separation between the readout electrodes at a rate greater than the rate of such ambipolar drift of photocarriers through the active length of such strip. The detector apparatus of the present invention may also include an optical mask over the region between the two readout electrodes with a corresponding extension in length of the active region of the strip to partially compensate for signal lost due to the optical masking of the readout region of the strip.

BRIEF DESCRIPTION OF THE DRAWINGS

The above and other objects of the present invention are achieved in the illustrative embodiments as decribed with respect to the Figures in which.

DETAILED DESCRIPTION OF THE PREFERRED EMBODIMENT(S)

Figure 1:
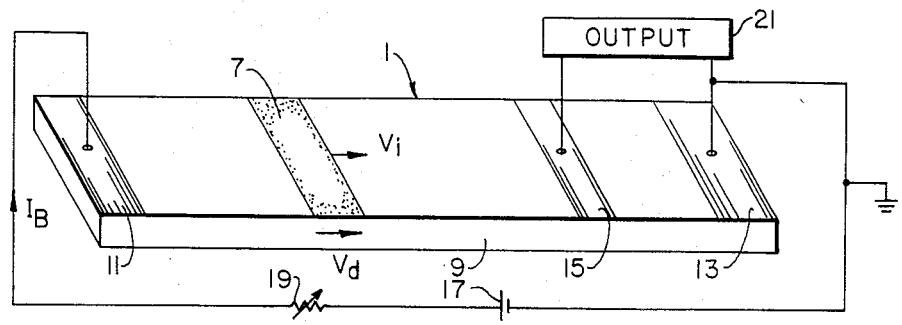
FIG. 1 is an illustration of a non-delineated detector array of the prior art.

The following is a description of the prior art device of FIG. 1 in part as described for the apparatus of U.S. Pat. No. 3,995,159. As shown in FIG. 1, the photoconductive device 1 comprises an elongated strip 9 of semiconductor material having a narrow band gap, e.g., mercury cadmium telluride, indium antimonide or lead tin telluride. The device 1 also comprises two metallic electrodes 11 and 13, e.g., of aluminium, deposited at opposite ends of the strip 9 and an electrode 15, e.g., of aluminum, deposited near the electrode 13. A constant bias current $I_B$ is arranged to flow lengthwise through the strip 9 by a battery 17 connected in series with a variable resistor 19 between the electrodes 11 and 13. An output or readout circuit 21 is connected between the electrodes 13 and 15, which act as readout electrodes.

Figure 2:
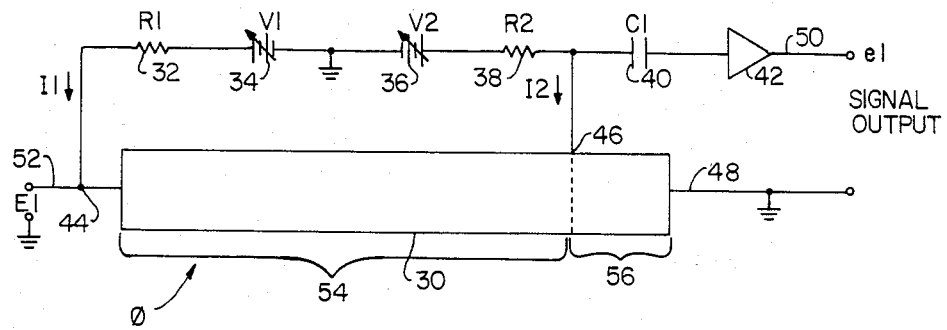
FIG. 2 illustrates a first embodiment of the non-delineated detector array of the present invention.

Normally, the strip 9 will be cooled in a liquid nitrogen cooling vessel (not shown in FIG. 1), whereas the battery 17, resistor 19 and the output circuit 21 will be outside the vessel at room temperature. Hence, a conventional encapsulation arrangement (also not shown) is required to isolate these two parts of the device 1 thermally while still providing the appropriate electrical connections between them. As shown in FIG. 2 of the forementioned patent, an infrared image is projected onto the strip 9 by a conventional scanning and focussing system. Such scanning and focussing system may include, for example, a mirror which is continuously rotatable about a vertical axis, and another mirror which is rotatable in steps about a horizontal axis, and a lens. The system scans a scene in a raster fashion and produces a corresponding infrared image region-by-region on the strip 9 of the device 1.

The imaging consists of a row of integral elemental image regions corresponding to a row of integral elemental scene regions. The image regions travel along the strip 9 with a velocity $V_i$ by rotation of the mirror which is rotatable about the vertical axis. Images corresponding to the various rows of elemental regions in the scene are projected in turn onto the strip 9 by stepwise rotation of the mirror which is rotatable about the horizontal axis. The battery 17 is arranged so that minority carriers drift in the strip 9 in the same direction as that in which the image region 7 travels along the strip 9, i.e., towards the electrode 13 as illustrated. The resistor 11 is adjusted so that the bias current $I_B$ provides a minority carrier drift (more strictly an ambipolar drift) having a velocity $V_d$ which matches the image scan velocity $V_i$.

The infrared radiation photons forming the image region 7 create electron-hole pairs, i.e., photocarriers, in the region of the strip 9 on which they are incident, thereby increasing the carrier densities locally above their equilibrium values. Since the excess minority carriers drift towards the electode 15 with a drift velocity $V_d$ which matches $V_i$, the minority carrier density corresponding to the image region 7 increases continuously during transit towards the electrode 15. The rate of generation of electron-hole pairs along the path of the image region 7 will depend on the photon flux in the image region 7, i.e., the intensity of that region. Thus, the excess minority carrier density at any given point along the travel path of the image region 7 modulates the local conductivity by an amount which is a measure of the intensity of the image region 7. Since the bias current $I_B$ is constant, the conductivity (and, hence, resistivity) modulation within the strip 9 will give rise to a local electric field variation. The local field variation in the strip 9 corresponding to the image region 7 and each other identical image regions (not shown) is picked up as a voltage change between the electrodes 15 and 13 and is amplified and processed by the output circuit 21 in a conventional way to provide a picture signal.

Thus, the operation of the detector of FIG. 1 may be discussed with respect to the detector of FIG. 2 as follows. The photoconductive detector 30 is used to give electronic signal output (el) in response to changing black body irradiance flux ($\phi$) which is focussed and scanned across its length with appropriate focussing optics and scan mirrors. The el signal is then used to provide an electronic representation of a thermal image which is focussed and scanned in the plane of the detector 30. The primary detector bias current I1 is provided such that an electric field E1 is established. The field E1 is set to a value such that instantaneous charge carrier density generated in detector 30 by flux ($\phi$) drifts at the same velocity as the image which is scanned across detector 30, thus providing an enhanced signal over what could be obtained by a detector of length 56, and at the same time providing the spatial resolution inherent to a detector of this shorter length.

By the present invention, a second bias current I2 is utilized in order to enable the integrated charge packet to be swept through the readout region having length 56 at a rate greater than the drift velocity ($V_d$) through the main section having length 54 of the detector 30. This carries an increased benefit in the way of an enhancement of the modulation transfer function (MTF) of the scene information by decreasing the time for signal readout. The time for readout could also be reduced by decreasing the length of the readout region having length 56. However, this technique causes a reduction in signal as the signal change is proportional to the distance the integrated charge packet travels through the detector material in the region having length 56.

Figure 3:
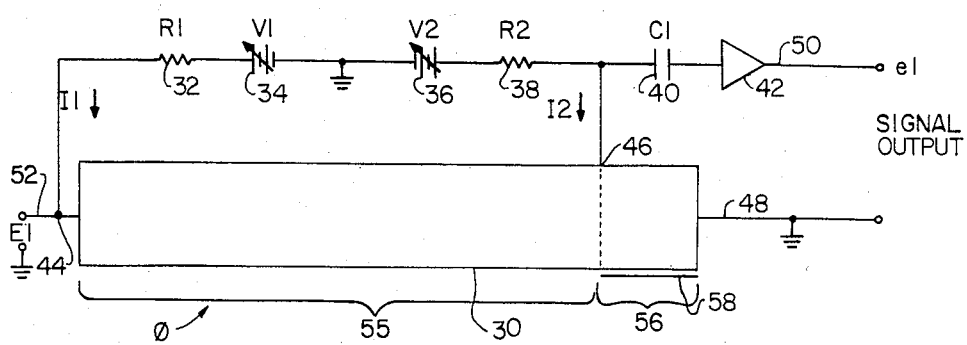
FIG. 3 is an illustration of an alternative embodiment of the non-delineated detector array of the present invention.

In order to prevent distortion of the real image which moves through the region having length 56 at the scan velocity, the region having length 56 can be optically masked, as shown in FIG. 3, such that there is no response change due to the real image indicated by flux ($\phi$). The region having length 55 is shown to be increased in length over the region having length 54 of FIG. 2 to partially compensate for the signal loss due to the optical masking of the region having length 56.

Thus, in the subject invention as shown in FIG. 2, the current I1 is provided by the voltage source (V1) 34 through resistor (R1) 32 to produce the voltage E1 between line 52 and signal ground. Current I1 is received at the input of the detector 30 at junction 44. Voltage source 34 and resistor 32 correspond to elements 17 and 19 of FIG. 1. Current I1 corresponds to current $I_B$. The secondary bias current I2 is provided by use of voltage source (V2) 36 and resistor (R2) 38 coupled to separate the regions having lengths 54 and 56 by coupling at junction 46. The signal output (el) is provided via the capacitor (C1) 40 and amplifier 42, such that the signal output is produced between line 50 and signal ground line 48. Voltage sources V1 and V2 are shown to be variable in order to be able to select the proper currents, however, resistors R1 and R2 could have been variable for the same purpose. The detector apparatus of FIG. 3 is shown to be similar to that of FIG. 2, except that it can be seen that the region having length 55 is longer (by about the length of the region having length 56) than the region having length 54 and the optical mask 58 is inserted in order to prevent distortion of the real image and to provide a signal output level substantially equivalent to the embodiment of FIG. 2.

Having described the invention, what is claimed as new and novel and for which it is desired to secure Letters Patent is:

1. In a thermal radiation imaging system comprising detector means and scanning means for scanning a thermal radiation image across said detector means, a radiaton detector comprising:

A. an elongated strip of semiconductor material which is photoconductive by the generation of electron and hole photocarriers when said radiation image is scanned along said strip;

B. means for applying lengthwise through said strip a bias electric current producing an ambipolar drift of photocarriers in said strip whose velocity and direction of drift substantially match respectively the velocity and direction of scanning of said strip;

C. first and second readout electrodes connected to said strip near one end of said strip, said strip having an active length and said readout electrodes having a separation such that minority photocarriers in said drift reach said separation between said readout electrodes in a time less than the average electron hole recombination time of said semiconductor material; and wherein the improvement comprises D. means for applying a second bias electric current such that the drift of said photocarriers in said strip between said readout electrodes is at a rate greater than the drift of said photocarriers through said active length of said strip.

2. A detector as in claim 1 further comprising means for preventing said radiation image to be scanned on said strip in the region between said readout electrodes.

3. A detector as in claim 2 wherein said means for preventing is an optical mask.

4. A detector as in claim 3 wherein the length of said strip with said means for preventing includes a said active length which is longer than the said active length of said strip without said means for preventing.

5. A detector as in claim 4 wherein the difference in said active lengths is substantially equal to the distance between said readout electrodes.

6. A detector as in claim 1 wherein said semiconductor material includes mercury cadmium telluride.

7. A detector comprising:

A. an elongated strip of semiconductor material which is photoconductive by the generation of electron and hole photocarriers when an image is moved along said strip, said strip including an acitve region and a readout region connected at a first readout electrode and wherein the other end of said readout region is coupled to a second readout electrode;

B. means for applying through said active region of said strip a first bias electric current producing an ambipolar drift of photocarriers in said strip whose velocity substantially matches the velocity of the movement of said image along said strip;

C. means for applying through said readout region of said strip a second bias electric current such that the drift of said photocarriers in the readout region of said strip has a velocity which is greater than the velocity of the drift of said photocarriers in said active region of said strip; and D. means, coupled between said first and second readout electrodes, for providing a signal output indicative of said image.

8. A detector as in claim 7 further comprising means for preventing said radiation image to be scanned on said strip in the region between said readout electrodes.

9. A detector as in claim 8 wherein said means for preventing is an optical mask.

10. A detector as in claim 9 wherein the length of said strip with said means for preventing includes a said active length which is longer than the said active length of said strip without said means for preventing.

11. A detector as in claim 7 wherein said first and second readout electrodes have a separation such that minority photocarriers in said drift reach said separation in a time less than the average electron hole recombination time of said semiconductor material.

* * * * *